(12) United States Patent
Bao et al.

(10) Patent No.: US 11,889,677 B2
(45) Date of Patent: Jan. 30, 2024

(54) METHOD FOR FORMING CAPACITOR HOLES

(71) Applicant: CHANGXIN MEMORY TECHNOLOGIES, INC., Hefei (CN)

(72) Inventors: Xifei Bao, Hefei (CN); Jinguo Fang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 310 days.

(21) Appl. No.: 17/455,474

(22) Filed: Nov. 18, 2021

(65) Prior Publication Data

US 2022/0077157 A1    Mar. 10, 2022

Related U.S. Application Data

(63) Continuation of application No. PCT/CN2021/092283, filed on May 8, 2021.

(30) Foreign Application Priority Data

May 26, 2020   (CN) ......................... 202010454225.X

(51) Int. Cl.
 *H01L 21/00* (2006.01)
 *H10B 12/00* (2023.01)
 *H01L 49/02* (2006.01)
(52) U.S. Cl.
 CPC ........... *H10B 12/038* (2023.02); *H01L 28/60* (2013.01)
(58) Field of Classification Search
 CPC ............................. H10B 12/038; H01L 28/60
 See application file for complete search history.

(56) References Cited

U.S. PATENT DOCUMENTS

| 7,084,029 | B2 | 8/2006 | Kundalgurki |
| 9,553,095 | B2 * | 1/2017 | Tu ........................... H01L 28/40 |

(Continued)

FOREIGN PATENT DOCUMENTS

| CN | 1954263 A | 4/2007 |
| CN | 102024706 B | 6/2012 |

(Continued)

OTHER PUBLICATIONS

International Search Report as cited in PCT Application No. PCT/CN2021/092283 dated Jul. 22, 2021, 4 pages.

(Continued)

*Primary Examiner* — Richard A Booth
(74) *Attorney, Agent, or Firm* — Cooper Legal Group, LLC

(57) ABSTRACT

A method for forming capacitor holes is provided. By forming a first material layer and a second material layer which are thinner and are different in materials on a supporting layer as an over-etching depth adjusting layer, when etching holes are formed in a hard mask layer and the hard mask layer is over-etched, a certain over-etching depth may be formed in the second material layer, and the etching holes terminate in the first material layer, so that the etching depth of the etching holes can be corrected and adjusted. Accordingly, the etching holes formed after the hard mask layer is over-etched can have the same depth or have a small depth difference. Therefore, time points at which the plurality of capacitors holes formed expose the corresponding connecting pads are substantially the same or differ very little, improving the performance of the DRAM.

12 Claims, 4 Drawing Sheets

(56) References Cited

U.S. PATENT DOCUMENTS

| | | |
|---|---|---|
| 2003/0136996 A1 | 7/2003 | Park |
| 2005/0272219 A1 | 12/2005 | Coolbaugh et al. |
| 2006/0043590 A1 | 3/2006 | Chen et al. |
| 2010/0224925 A1* | 9/2010 | Ching ................ H01L 27/0629 |
| | | 257/532 |
| 2011/0193193 A1 | 8/2011 | Dube et al. |
| 2016/0111343 A1 | 4/2016 | Lu et al. |
| 2022/0285376 A1* | 9/2022 | Chen ..................... H10B 53/40 |

FOREIGN PATENT DOCUMENTS

| | | |
|---|---|---|
| CN | 103426745 A | 12/2013 |
| CN | 107895721 A | 4/2018 |
| CN | 105633022 B | 8/2018 |
| CN | 208589410 U | 3/2019 |
| CN | 208637425 U | 3/2019 |
| CN | 110634733 A | 12/2019 |
| CN | 110957304 A | 4/2020 |
| JP | H10303379 A | 11/1998 |
| JP | 2013191674 A | 9/2013 |

OTHER PUBLICATIONS

Written Opinion cited in PCT/CN2021/092283, dated Jul. 22, 2021, 6 pages.
Notice of Allowance of the Chinese application No. 202010454225. X, dated Apr. 2, 2023, 5 pages.

* cited by examiner

METHOD FOR FORMING CAPACITOR HOLES

CROSS-REFERENCE TO RELATED APPLICATIONS

The present disclosure is a continuation application of International Patent Application No. PCT/CN2021/092283, filed on May 8, 2021, which claims the priority to Chinese Patent Application No. 202010454225.X, filed on May 26, 2020 and entitled "METHOD FOR FORMING CAPACITOR HOLES". The entire contents of International Patent Application No. PCT/CN2021/092283 and Chinese Patent Application No. 202010454225.X are incorporated herein by reference.

TECHNICAL FIELD

The present invention relates to the field of memory manufacturing, and more particularly to a method for forming capacitor holes in a DRAM.

BACKGROUND

A dynamic random access memory (DRAM) is a semiconductor storage device commonly used in computers, and consists of many repeated memory cells. Each of the memory cells generally includes a capacitor and a transistor. A gate of the transistor is connected to a word line, a drain thereof is connected to a bit line, and a source thereof is connected to the capacitor. A voltage signal on the word line is capable of controlling ON/OFF of the transistor. Further, data information stored in the capacitor is read by means of the bit line, or the data information is written into the capacitor by means of the bit line for storage.

A method for forming a DRAM is provided in the prior art. The method includes: providing a semiconductor substrate; forming a trench transistor in the semiconductor substrate, wherein the trench transistor includes a gate in the semiconductor substrate as well as a source and a drain on two sides of the gate; forming a dielectric layer covering the trench transistor on the semiconductor substrate, wherein connecting pads connected to the source are formed in the dielectric layer; forming a supporting layer on the dielectric layer; etching the supporting layer to form a plurality of capacitor holes in the supporting layer, wherein each of the capacitor holes exposes the surface of the respective connecting pad; forming a first electrode layer on an inner wall surface of the capacitor hole; forming a capacitor dielectric layer on the first electrode layer; and forming a second electrode layer on the capacitor dielectric layer.

However, the plurality of capacitor holes formed in the above method could be uneven in size, which affects the performance of the DRAM.

SUMMARY

The technical problem to be solved by the present disclosure is how to improve the evenness of the size of capacitor holes in a DRAM.

The present disclosure provides a method for forming a capacitor hole. The method includes the following steps:
providing a semiconductor base in which a plurality of connecting pads are formed;
forming a supporting layer on the semiconductor base;
forming an over-etching depth adjusting layer on the supporting layer, wherein the over-etching depth adjusting layer comprises a first material layer on the supporting layer and a second material layer on the first material layer, the first material layer and the second material layer are different in materials and different from a hard mask layer formed subsequently in materials, and the first material layer and the second material layer are both thinner than the hard mask layer formed subsequently;
forming the hard mask layer on the over-etching depth adjusting layer;
etching the hard mask layer to form a plurality of etching holes, and when etching the hard mask layer to form the etching holes, over-etching the hard mask layer to reach a certain over-etching depth in the second material layer, and making the etching holes terminate in the first material layer; and
etching the first material layer and the supporting layer along the etching holes to form a plurality of capacitor holes exposing surfaces of the respective connecting pads in the supporting layer.

Optionally, when the hard mask layer is etched to form the plurality of etching holes, the etching selectivity of the hard mask layer relative to the second material layer is greater than that of the hard mask layer relative to the first material layer.

Optionally, when the hard mask layer is etched to form the plurality of etching holes, the etching selectivity of the hard mask layer relative to the second material layer is greater than 2:1, the etching selectivity of the hard mask layer relative to the first material layer is greater than 7:1, and the etching selectivity of the second material layer relative to the first material layer is greater than 3:1.

Optionally, when the hard mask layer is etched to form the plurality of etching holes, the etching selectivity of the hard mask layer relative to the second material layer ranges from 3:1 to 4:1, the etching selectivity of the hard mask layer relative to the first material layer ranges from 8:1 to 10:1, and the etching selectivity of the second material layer relative to the first material layer ranges from 4:1 to 6:1.

Optionally, the thickness of the first material layer and the second material layer is $1/20$ to $1/40$ of the thickness of the hard mask layer.

Optionally, the hard mask layer is made of polysilicon, the second material layer is made of silicon nitride or silicon carbide, and the first material layer is made of silicon oxide.

Optionally, the thickness of the hard mask layer ranges from 700 nm to 900 nm, the thickness of the second material layer ranges from 10 nm to 20 nm, and the thickness of the first material layer ranges from 10 nm to 20 nm.

Optionally, the hard mask layer is etched by employing anisotropic dry etching.

Optionally, an etching gas employed in the anisotropic dry etching includes $Cl_2$.

Optionally, the supporting layer is of a single-layer structure or a multilayer stack structure.

Optionally, when the supporting layer is of the single-layer structure, single-sided capacitors are formed in the capacitor holes after the capacitor holes are formed.

Optionally, when the supporting layer is of the multilayer stack structure, the multilayer stack structure comprises a plurality of sacrificial layers and sub-supporting layers stacked alternately; after the capacitor holes are formed, first electrode layers are formed on inner walls of the capacitor holes; and the sacrificial layers between the capacitor holes are removed, capacitor dielectric layers and second electrode layers on the capacitor dielectric layers are filled in positions from which the sacrificial layers are removed and the capacitor holes, and thus a plurality of double-sided capacitors are formed.

Compared with the prior art, the technical solution of the present disclosure has the following advantages.

In the method for forming the capacitor holes of the DRAM of the present disclosure, after the supporting layer is formed on the semiconductor base, the over-etching depth adjusting layer is formed on the supporting layer, wherein the over-etching depth adjusting layer includes the first material layer on the supporting layer and the second material layer on the first material layer, the first material layer and the second material layer are different in materials and different from the hard mask layer formed subsequently in materials, and the first material layer and the second material layer are both thinner than the hard mask layer formed subsequently. Then, the hard mask layer is formed on the over-etching depth adjusting layer, wherein by forming the first material layer and the second material layer which are thinner and are different in materials on the supporting layer as the over-etching depth adjusting layer, when the etching holes are formed in the hard mask layer and the hard mask layer is over-etched, a certain over-etching depth may be formed in the second material layer, and the etching holes terminate in the first material layer, so that the etching depth of the etching holes can be corrected and adjusted. Accordingly, the etching holes formed after the hard mask layer is over-etched can have the same depth or have a small depth difference. Subsequently, when the supporting layer is etched along the etching holes to form the capacitor holes, which expose the surfaces of the connecting pads, in the supporting layer, it is impossible to affect the etching of the capacitor holes due to the difference in depths of the etching holes. Therefore, time points at which the plurality of capacitors holes formed expose the corresponding connecting pads are substantially the same or differ very little, preventing some capacitor holes from being laterally etched when the capacitor holes are formed. Moreover, the plurality of capacitor holes are even in sizes, improving the performance of the DRAM.

Further, when the hard mask layer is etched to form the plurality of etching holes, the etching selectivity of the hard mask layer relative to the second material layer is greater than that of the hard mask layer relative to the first material layer, such that when the hard mask layer is over-etched, rates at which the second material layer and the first material layer are etched are sequentially reduced, which is advantageous for controlling and forming positions of bottoms of the plurality of etching holes. As a result, the etching holes formed after the hard mask layer is over-etched may have the same depth or have a small depth difference.

Further, when the thickness of the first material layer and the second material layer is 1/20 to 1/40 of the thickness of the hard mask layer, and subsequently, the hard mask layer is etched to form the plurality of etching holes, the etching selectivity of the hard mask layer relative to the second material layer ranges from 3:1 to 4:1, the etching selectivity of the hard mask layer relative to the first material layer ranges from 8:1 to 10:1, and the etching selectivity of the second material layer relative to the first material layer ranges from 4:1 to 6:1. By setting specific thicknesses and specific etching selectivity of the first material layer and the second material layer relative to the hard mask layer, the etching depth of the etching holes may be more simply and effectively corrected and adjusted in a process of forming the etching holes, such that the etching holes formed after the hard mask layer is over-etched may have the same depth or have a small depth difference.

DESCRIPTION OF EMBODIMENTS

Figure 1:
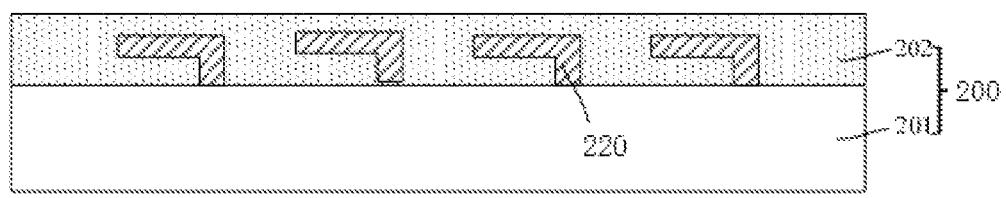
FIG. 1 to FIG. 6 are schematic structural diagrams of a process of forming capacitor holes of a DRAM according to an embodiment of the present disclosure.

As described in the background art, capacitor holes formed in the above method may be uneven in size (for example, some capacitor holes are larger, and some capacitor holes may be smaller), which affects the performance of a DRAM.

It is found from studies on an existing process for forming a DRAM that in the existing process, after a supporting layer (generally made of silicon nitride or silicon oxide) is formed, a hard mask layer (generally made of polysilicon) is formed on the supporting layer. However, in order to ensure the stopping performance of the hard mask layer when the supporting layer is etched, the hard mask layer generally has a great thickness (greater than 800 nm). After the hard mask layer is formed, a patterned mask layer is formed on the hard mask layer. The hard mask layer is etched by using the patterned mask layer as a mask to form a plurality of etching holes in the hard mask layer. The hard mask layer during the etching must be over-etched enough to etch through the hard mask layer. Therefore, a part of the supporting layer will be etched when the hard mask layer is over-etched, so that bottoms of the etching holes will be disposed in the supporting layer. However, the existing over-etching process easily makes the bottoms of the etching holes have different depths in the supporting layer (the reason why the bottoms of the etching holes have different depths in the supporting layer is as follows: in an aspect, plasma etching is employed when the hard mask layer is etched. The concentration of plasma distributed above the middle of a wafer in an etching chamber is greater than that of plasma distributed above the edge of the wafer. In another aspect, in the existing process, in order to form capacitor holes with smaller size, a double patterning process is generally employed to form the patterned mask layer. Particularly, a plurality of discrete first mask patterns arranged in a first direction are formed on the hard mask layer by the double patterning process. A plurality of discrete second mask patterns arranged in a second direction are formed on the first mask pattern by the double patterning process. The first direction and the second direction are at an included angle. The first mask pattern and the second mask pattern form the patterned mask layer. When the dual patterning process is employed to form the first mask pattern and the second mask pattern, over-etching openings of varying depths are formed on the surface of the hard mask layer due to the difference in the etching selectivity, and the over-etching openings of varying depths are conducted to the supporting layer when the hard mask layer is etched). The bottoms of the etching holes have different depths in the supporting layer. In one case, when the supporting layer is etched along the plurality of etching holes subsequently to form the plurality of capacitor holes, some capacitor holes (capacitor holes formed by etching along deeper etching holes) firstly expose surfaces of the corresponding connecting pads. Some capacitive holes (capacitor holes formed by etching along shallower etching hole) will expose the surfaces of the corresponding connecting pads later. As the etching process continues, an etching plasma moves towards the capacitor holes exposing the connecting pads firstly. Since the connecting pads do not consume the etching plasma, the etching plasma will etch the supporting layer on sides of the capacitor holes, which further increases the sizes of the capacitor holes exposing the connecting pads firstly. Finally, when all the capacitor holes are formed, some capacitor holes may be larger, so that the plurality of formed capacitor holes will be uneven in sizes. Subsequently, when capacitor structures are formed in the capacitor holes, the performance of the capacitor structures may be influenced, and thus the performance of the DRAM may be influenced. In another case, in a case where the etching time is the same, some capacitor holes are etched to the bottoms thereof so as to be connected to the connecting pads, and some capacitor holes may not be etched to the bottoms thereof so as not to be connected to the connecting pads, which causes some capacitors to fail to store charges. As a result, the overall device performance may be influenced. To this end, the present disclosure provides a method for forming capacitor holes of a DRAM. After a supporting layer is formed on a semiconductor base, an over-etching depth adjusting layer is formed on the supporting layer, wherein the over-etching depth adjusting layer comprises a first material layer on the supporting layer and a second material layer on the first material layer, the first material layer and the second material layer are different in materials and different from a hard mask layer formed subsequently in materials, and the first material layer and the second material layer are both thinner than the hard mask layer formed subsequently. Then, the hard mask layer is formed on the over-etching depth adjusting layer, wherein by forming the first material layer and the second material layer which are thinner and are different in materials on the supporting layer as the over-etching depth adjusting layer, when etching holes are formed in the hard mask layer and the hard mask layer is over-etched, a certain over-etching depth may be formed in the second material layer, and the etching holes terminate in the first material layer, so that the etching depth of the etching holes can be corrected and adjusted. Accordingly, the etching holes formed after the hard mask layer is over-etched can have the same depth or have a small depth difference. Subsequently, when the supporting layer is etched along the etching holes to form the capacitor holes, which expose the surfaces of the connecting pads, in the supporting layer, it is impossible to affect the etching of the capacitor holes due to the difference in depths of the etching holes. Therefore, time points at which the plurality of capacitors holes formed expose the corresponding connecting pads are substantially the same or differ very little, preventing some capacitor holes from being laterally etched when the capacitor holes are formed. Moreover, the plurality of capacitor holes are even in sizes, improving the performance of the DRAM.

For clearer descriptions of the objectives, technical solutions, and advantages of the present disclosure, embodiments of the present disclosure are described in detail hereinafter with reference to the accompanying drawings. For the convenience of description, when embodiments of the present disclosure are described in detail, schematic diagrams will not be partially enlarged according to a general scale, and only serve as examples, which should not limit the protection scope of the present disclosure here. In addition, three-dimensional sizes including length, width and depth should be included during actual manufacturing.

With reference to FIG. 1, a semiconductor base 200 is provided, wherein a plurality of connecting pads 220 are formed in the semiconductor base 200.

The semiconductor base 200 serves as a platform in a subsequent process. In an embodiment, the semiconductor base 200 includes a semiconductor substrate 201 and at least one dielectric layer 202 on the semiconductor substrate, wherein the connecting pads are disposed in the dielectric layer 202.

The semiconductor substrate may be made of silicon (Si), germanium (Ge), or silicon germanium (GeSi), or silicon carbide (SiC); or made of silicon-on-insulator (SOI) or germanium-on-insulator (GOI); or made of other materials, for example, group III-V compounds such as gallium arsenide. The semiconductor substrate 201 in this embodiment is made of silicon. The semiconductor substrate is doped with certain impurity ions as needed, wherein the impurity ions may be N-type impurity ions or P-type impurity ions.

A plurality of trench transistors are formed in the semiconductor substrate, wherein each of the trench transistors includes an active region; at least one trench in the active region, wherein the trench divides the active region into a drain region and at least one source region, particularly, when there is one trench, the trench divides the active region into a source region and a drain region on two sides of the trench, respectively, and when there two trenches, the two trenches are parallel to each other, and the two trenches divide the active region into a drain region between the two trenches and two source regions outside the two trenches, respectively; and a gate structure or word line (WL) in the trench. The drain region of the trench transistor is subsequently connected to a bit line, and the source region of the trench transistor is subsequently connected to a capacitor. The connecting pads 220 formed in the dielectric layer are connected to the corresponding source regions, particularly, the connecting pads 220 may be connected to the corresponding source regions by means of a metal connection structure.

The dielectric layer 202 may be of a single-layer structure or multilayer (more than or equal to 2 layers) stack structure. The dielectric layer may be made of silicon nitride, silicon oxynitride, silicon oxide, FSG (fluorine-doped silica), BSG (boron-doped silica), PSG (phosphorus-doped silica) or BPSG (boron-phosphorus-doped silica), a low-dielectric-constant material, other suitable materials and/or a combination of the above.

Figure 2:
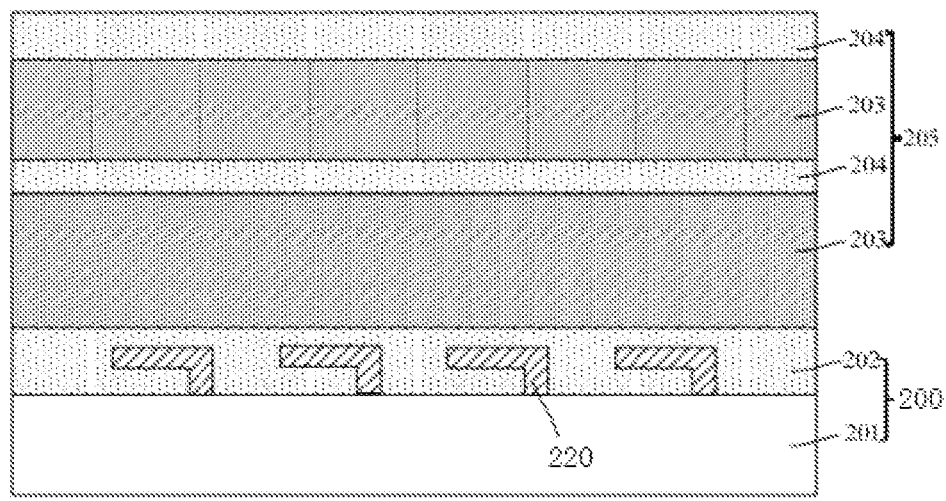

With reference to FIG. 2, a supporting layer 205 is formed on the semiconductor base 200.

The supporting layer 205 is configured to define and support capacitor structures to be formed subsequently.

In this embodiment, the supporting layer 205 is of a multilayer stack structure, and the multilayer stack structure includes a plurality of sacrificial layers 203 and sub-supporting layers 204 stacked alternately. In this embodiment, the multilayer stack structure includes four layers, that is, two sacrificial layers 203 and two sub-supporting layers 204 as an example for description. The bottommost layer in the multilayer stack structure is one sacrificial layer 203, and the topmost layer in the multilayer stack structure is one sub-supporting layer 204.

The sacrificial layers are provided in the supporting layer 205, in order to form double-sided capacitors in positions from which the sacrificial layers are removed and the capacitor holes by removing the sacrificial layers subsequently. The sacrificial layers 203 and the sub-supporting layers 204 are different in materials. The sacrificial layers 203 may be made of one of silicon oxide, silicon nitride, silicon oxynitride, silicon oxycarbide and silicon carbonitride. The sub-supporting layers 204 may be made of one of silicon oxide, silicon nitride, silicon oxynitride, silicon oxycarbide and silicon carbonitride. In this embodiment, the sub-supporting layers 204 are made of silicon nitride, and the sacrificial layers 203 are made of silicon oxide.

In other embodiments, the supporting layer may be of a single-layer structure. Subsequently, after the capacitor holes are formed in the supporting layer, single-sided capacitor structures are formed in the capacitor holes.

In an embodiment, the thickness of the supporting layer 205 ranges from 2000 nm to 3000 nm. In this embodiment, the thickness of the supporting layer 205 is 2800 nm.

Figure 3:
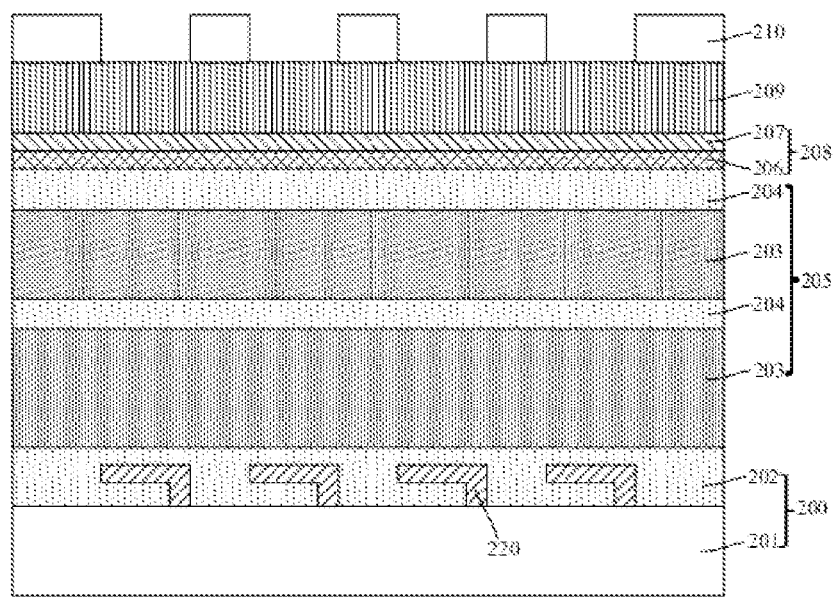

With reference to FIG. 3, an over-etching depth adjusting layer 208 is formed on the supporting layer 205, wherein the over-etching depth adjusting layer 208 includes a first material layer 206 on the supporting layer 205 and a second material layer 207 on the first material layer 206, the first material layer 206 and the second material layer 207 are different in materials and different from the hard mask layer formed subsequently in materials. The first material layer 206 and the second material layer 207 are thinner than the hard mask layer formed subsequently. The hard mask layer 209 is formed on the over-etching depth adjusting layer.

In the present disclosure, the over-etching depth adjusting layer 208 is formed on the supporting layer 205, wherein the over-etching depth adjusting layer 208 includes the first material layer 206 and the second material layer 207 on the first material layer 206, the first material layer 206 and the second material layer 207 are different in materials and different from the hard mask layer 209 formed subsequently in materials, and the first material layer 206 and the second material layer 207 are both thinner than the hard mask layer 209 formed subsequently. By forming the first material layer and the second material layer which are thinner and are different in materials as the over-etching depth adjusting layer, when the etching holes are formed in the hard mask layer 209 and the hard mask layer is over-etched, a certain over-etching depth may be formed in the second material layer, and the etching holes terminate in the first material layer, so that the etching depth of the etching holes can be corrected and adjusted. Accordingly, the etching holes formed after the hard mask layer 209 is over-etched may have the same depth or have a small depth difference. Subsequently, when the supporting layer is etched along the etching holes to form the capacitor holes, which expose the surfaces of the connecting pads, in the supporting layer, it is impossible to affect the etching of the capacitor holes due to the difference in depths of the etching holes. Therefore, time points at which the plurality of capacitors holes formed expose the corresponding connecting pads are substantially the same or differ very little, preventing some capacitor holes from being laterally etched when the capacitor holes are formed. Moreover, the plurality of capacitor holes are even in sizes, improving the performance of the DRAM.

In an embodiment, a patterned photoresist layer 210 is formed on the hard mask layer 209, and the patterned photoresist layer 210 serves as a mask when the hard mask layer 209 is etched subsequently.

In another embodiment, a plurality of discrete first mask patterns arranged along a first direction are formed on the hard mask layer 209, a plurality of discrete second mask patterns arranged along a second direction are formed on the first mask patterns. The first direction and the second direction are at an included angle. Subsequently, the hard mask layer is etched by using the first mask pattern and the second mask pattern as a mask.

In an embodiment, when the hard mask layer 209 is etched subsequently to form the plurality of etching holes, the etching selectivity of the hard mask layer 209 relative to the second material layer 207 is greater than that of the hard mask layer 209 relative to the first material layer 206, such that when the hard mask layer is over-etched, rates at which the second material layer and the first material layer are etched are sequentially reduced, which is advantageous for controlling and forming positions of bottoms of the plurality of etching holes. As a result, the etching holes formed after the hard mask layer 209 is over-etched may have the same depth or have a small depth difference.

In a specific embodiment, when the thickness of the first material layer and the second material layer is $1/20$ to $1/40$ of the thickness of the hard mask layer, which may be $1/20$, $1/30$ or $1/40$. Subsequently, when the hard mask layer 209 is etched to form the plurality of etching holes, the etching selectivity of the hard mask layer 209 relative to the second material layer 207 is greater than 2:1, and may range from 3:1 to 4:1, and particularly may be 3:1 or 4:1. The etching selectivity of the hard mask layer relative to the first material layer 206 is greater than 7:1, and may range from 8:1 to 10:1, and particularly may be 8:1, 9:1 or 10:1. The etching selectivity of the second material layer 207 relative to the first material layer 206 is greater than 3:1, and may range from 4:1 to 6:1, and particularly may be 4:1, 5:1 or 6:1. By setting specific thicknesses and specific etching selectivity of the first material layer 206 and the second material layer 207 relative to the hard mask layer, the etching depth of the etching holes may be more simply and effectively corrected and adjusted in a process of forming the etching holes, such that the etching holes formed after the hard mask layer 209 is over-etched may have the same depth or have a small depth difference.

In order to make the hard mask layer 209 have a sufficient mask stopping ability when the supporting layer is subsequently etched, the thickness of the hard mask layer 209 is generally great (greater than 500 nm), and the second material layer 207 and the first material layer 206 may not be too thick or thin. If the second material layer 207 and the first material layer 206 are too thick, a high aspect ratio of the patterned hard mask layer 209 in a process of forming etching holes is increased and the etching difficulty is increased; if the second material layer 207 and the first material layer 206 are too thin, the patterned hard mask layer 209 may not play a role of a stopping layer to a certain extent, and the etching difficulty is also increased, which increases the difficulty in making the etching holes formed after the hard mask layer 209 is over-etched have the same depth or have a small depth difference. In this embodiment, the hard mask layer 209 is made of polysilicon, the second material layer 207 is made of silicon nitride or silicon carbide, and the first material layer 206 is made of silicon oxide. The thickness of the hard mask layer 209 ranges from 700 nm to 900 nm, which may be 700 nm, 800 nm, or 900 nm. The thickness of the second material layer 207 ranges from 10 nm to 20 nm, which may be 10 nm, 15 nm, or 20 nm. The thickness of the first material ranges from 10 nm to 20 nm, which may be 10 nm, 15 nm, or 20 nm.

Figure 4:
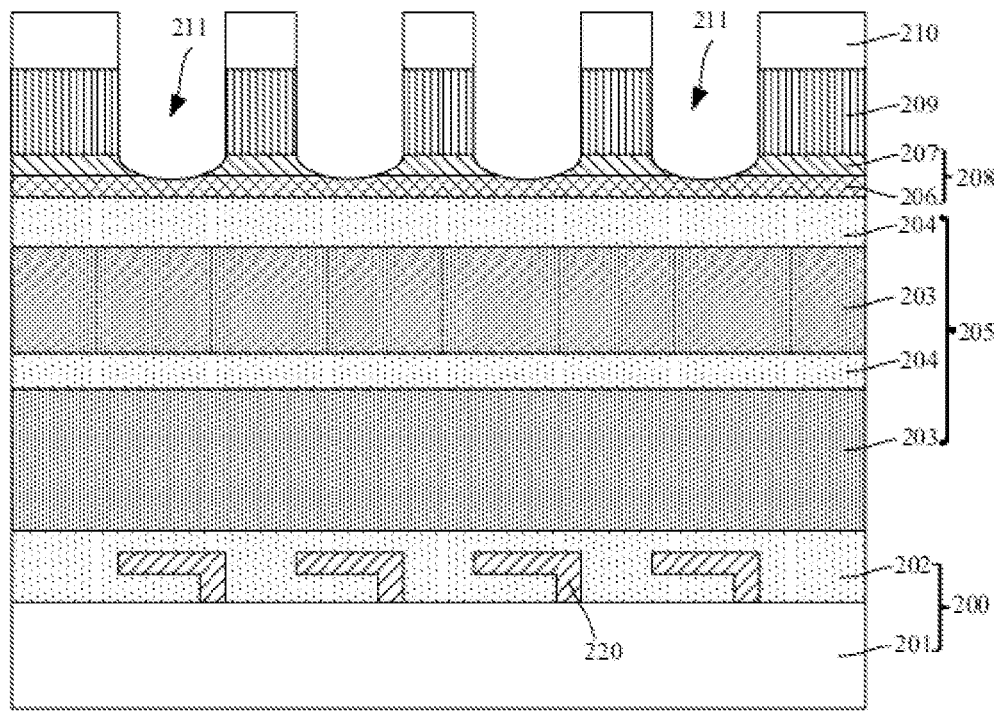

With reference to FIG. 4, the hard mask layer 209 is etched to form the plurality of etching holes 211, and when the hard mask layer 209 is etched to form the etching holes 211, the hard mask layer 209 is over-etched to reach a certain over-etching depth in the second material layer 207, and the etching hole 211 is enabled to terminate in the first material layer 206.

The hard mask layer 209 is etched by employing anisotropic dry etching. In this embodiment, the anisotropic dry etching is an anisotropic plasma etching process, and an etching gas used in the anisotropic dry etching includes $Cl_2$.

Figure 5:
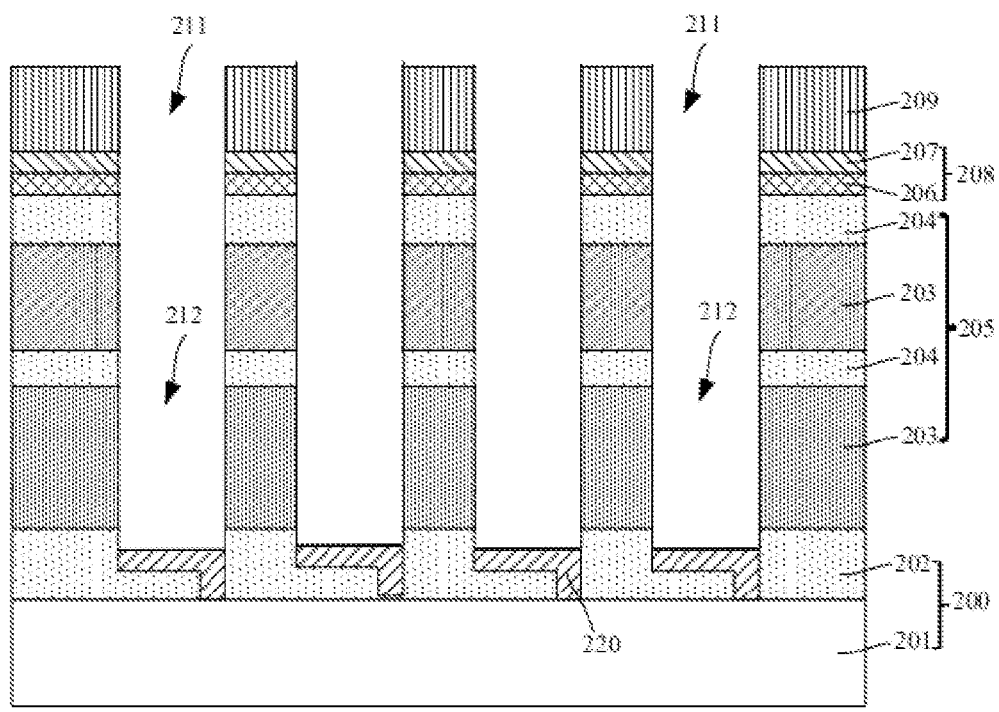

With reference to FIG. 5, the first material layer 206 and the supporting layer 205 are etched along the etching holes 211, and a plurality of capacitor holes 212 exposing the surfaces of the respective connecting pads 220 are formed in the supporting layer 205.

The first material layer 206 and the supporting layer 205 are etched by employed an anisotropic dry etching process.

In this embodiment, gas employed for etching the first material layer 206 and the supporting layer 205 includes one or more of $CF_4$, $C_4F_8$ and $CHF_3$.

Figure 6:
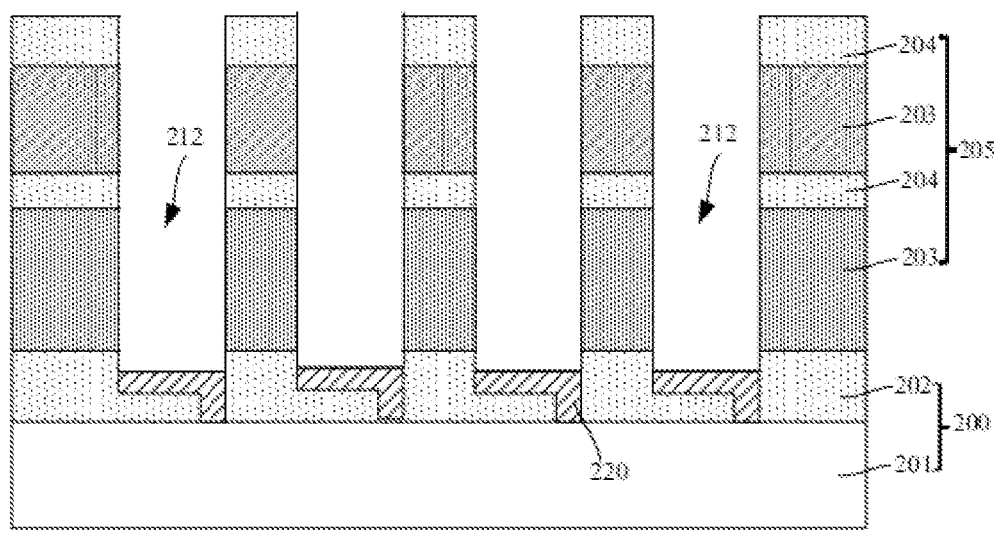

With reference to FIG. 6, the hard mask layer 209 and the over-etching depth adjusting layer 208 are removed.

In an embodiment, the hard mask layer 209 and the over-etching depth adjusting layer 208 may be removed by means of a separate etching process or a planarizing process. In another embodiment, the hard mask layer 209 and the over-etching depth adjusting layer 208 may be removed by means of the planarizing process when the first electrode layer is subsequently formed.

In this embodiment, after the capacitor holes 212 are formed, the method further includes: first electrode layers are formed on inner walls of the capacitor holes; the sacrificial layers between the capacitor holes are removed; and capacitor dielectric layers and second electrode layers on the capacitor dielectric layers are filled in positions from which the sacrificial layers are removed and the capacitor holes, and thus a plurality of double-sided capacitors are formed.

In other embodiments, when the supporting layer is of the single-layer structure, after the capacitor holes are formed, single-sided capacitors are formed in the capacitor holes, and the single-sided capacitors include first electrode layers on the inner walls of the capacitor holes, capacitor dielectric layers on the first electrode layers, and second electrode layers on the capacitor dielectric layers.

While the present disclosure has been disclosed above with some embodiments, they are not intended to limit the present disclosure. A person skilled in the art may utilized methods and technical contents disclosed above to make possible changes and modifications on the technical solution of the present disclosure without departing from the spirit and scope of the present disclosure. Therefore, any simple changes, equivalent variations and modifications made to the above embodiments according to the technical essence of the present disclosure without departing from the content of the technical solution of the present disclosure are within the protection scope of the technical solution of the present disclosure.

What is claimed is:

1. A method for forming capacitor holes, comprising:
providing a semiconductor base in which a plurality of connecting pads are formed;
forming a supporting layer on the semiconductor base;
forming an over-etching depth adjusting layer on the supporting layer, wherein the over-etching depth adjusting layer comprises a first material layer on the supporting layer and a second material layer on the first material layer, the first material layer and the second material layer are different in materials and different from a hard mask layer formed subsequently in materials, and the first material layer and the second material layer are both thinner than the hard mask layer formed subsequently;
forming the hard mask layer on the over-etching depth adjusting layer;
etching the hard mask layer to form a plurality of etching holes, and when etching the hard mask layer to form the etching holes, over-etching the hard mask layer to reach a certain over-etching depth in the second material layer, and making the etching holes terminate in the first material layer; and
etching the first material layer and the supporting layer along the etching holes to form a plurality of capacitor holes exposing surfaces of the respective connecting pads in the supporting layer.

2. The method for forming capacitor holes according to claim 1, wherein when the hard mask layer is etched to form the plurality of etching holes, an etching selectivity of the hard mask layer relative to the second material layer is greater than that of the hard mask layer relative to the first material layer.

3. The method for forming capacitor holes according to claim 2, wherein when the hard mask layer is etched to form the plurality of etching holes, the etching selectivity of the hard mask layer relative to the second material layer is greater than 2:1, the etching selectivity of the hard mask layer relative to the first material layer is greater than 7:1, and an etching selectivity of the second material layer relative to the first material layer is greater than 3:1.

4. The method for forming capacitor holes according to claim 3, wherein when the hard mask layer is etched to form the plurality of etching holes, the etching selectivity of the hard mask layer relative to the second material layer ranges from 3:1 to 4:1, the etching selectivity of the hard mask layer relative to the first material layer ranges from 8:1 to 10:1, and the etching selectivity of the second material layer relative to the first material layer ranges from 4:1 to 6:1.

5. The method for forming capacitor holes according to claim 3, wherein a thickness of the first material layer and the second material layer is 1/20 to 1/40 of a thickness of the hard mask layer.

6. The method for forming capacitor holes according to claim 5, wherein the hard mask layer is made of polysilicon, the second material layer is made of silicon nitride or silicon nitride carbide, and the first material layer is made of silicon oxide.

7. The method for forming capacitor holes according to claim 6, wherein the thickness of the hard mask layer ranges from 700 nm to 900 nm, the thickness of the second material layer ranges from 10 nm to 20 nm, and the thickness of the first material layer ranges from 10 nm to 20 nm.

8. The method for forming capacitor holes according to claim 7, wherein the hard mask layer is etched by employing anisotropic dry etching.

9. The method for forming capacitor holes according to claim 8, wherein an etching gas used in the anisotropic dry etching comprises $Cl_2$.

10. The method for forming capacitor holes according to claim 1, wherein the supporting layer is of a single-layer structure or multilayer stack structure.

11. The method for forming capacitor holes according to claim 10, wherein when the supporting layer is of the single-layer structure, single-sided capacitors are formed in the capacitor holes after the capacitor holes are formed.

12. The method for forming capacitor holes according to claim 10, wherein when the supporting layer is of the multilayer stack structure, the multilayer stack structure comprises a plurality of sacrificial layers and sub-supporting layers stacked alternately; after the capacitor holes are formed, first electrode layers are formed on inner walls of the capacitor holes; and the sacrificial layers between the capacitor holes are removed, capacitor dielectric layers and second electrode layers on the capacitor dielectric layers are filled in positions from which the sacrificial layers are removed and the capacitor holes, and thus a plurality of double-sided capacitors are formed.

* * * * *